United States Patent
Ohtani et al.

(10) Patent No.: US 6,744,672 B2
(45) Date of Patent: Jun. 1, 2004

(54) NON-VOLATILE SEMICONDUCTOR MEMORY DEVICE CAPABLE OF HIGH-SPEED DATA READING

(75) Inventors: Jun Ohtani, Hyogo (JP); Tsukasa Ooishi, Hyogo (JP); Hiroshi Kato, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 15 days.

(21) Appl. No.: 10/283,130

(22) Filed: Oct. 30, 2002

(65) Prior Publication Data

US 2003/0210570 A1 Nov. 13, 2003

(30) Foreign Application Priority Data

May 9, 2002 (JP) ........................................ 2002-134134

(51) Int. Cl.[7] .............................................. G11C 16/06
(52) U.S. Cl. ............................ 365/185.21; 365/185.18; 365/189.09
(58) Field of Search ....................... 365/185.21, 185.18, 365/189.09, 185.01, 205, 207

(56) References Cited

U.S. PATENT DOCUMENTS 6,081,456 A     6/2000   Dadashev
6,535,427 B1 *  3/2003   Takano et al. ......... 365/185.21

FOREIGN PATENT DOCUMENTS

JP          11-306779       11/1999

* cited by examiner

Primary Examiner—David Lam
(74) Attorney, Agent, or Firm—McDermott, Will & Emery

(57) ABSTRACT

When a non-volatile memory cell which can store two bits per one memory cell and pass current bidirectionally is used, a bias power source potential is provided also to a bit line BL4 adjacent to two bit lines (BL2 and BL2) passing a sense current BL2 and BL3. Switch units are provided corresponding to each bit line for selectively connect to any one of a ground power source line, read power source line or bias power source line. The current flowing from a sense amplifier circuit to the adjacent bit line BL4 via adjacent memory cell can be reduced, and thus the current in the sense amplifier circuit is stabilized quickly. Accordingly, a non-volatile semiconductor memory device allows high-speed data reading operation.

6 Claims, 13 Drawing Sheets

NON-VOLATILE SEMICONDUCTOR MEMORY DEVICE CAPABLE OF HIGH-SPEED DATA READING

BACKGROUND OF THE INVENTION

1. Field of the Invention

The present invention relates to a non-volatile semiconductor memory device, and more specifically, to a non-volatile semiconductor memory device having a transistor passing current bidirectionally as a memory cell.

2. Description of the Background Art

Among non-volatile semiconductor memory devices, one type of flash EEPROM, namely an NROM (Nitride Read Only Memory) type flash EEPROM (hereinafter referred to as NROM) has been attracting attention. An NROM has an ONO (Oxide Nitride Oxide) film as a gate insulating film, and is capable of storing two bits of information per one memory cell. By employing the NROM, chip area per one bit may be reduced compared to other non-volatile semiconductor memory device having a floating gate. The NROM is disclosed in U.S. Pat. No. 6,081,456.

FIG. 10 is a circuit diagram related to an operation of applying potential to bit lines of a memory cell array of a conventional NROM.

Referring to FIG. 10, memory cell array 2 includes bit lines BL1 to BL5, word lines WL1 to WLn, memory cells 111 to 114 having their gates connected to the word line WL1, and memory cells 121 to 124 having their gates connected to the word line WLn.

In the memory cell array 2, among a row of memory cells sharing the same word line, adjacent memory cells share one bit line. Specifically, memory cells 111 and 112 are connected to a bit line BL2 at a node NB and thus share the bit line BL2. Memory cells 112 and 113 are connected to a bit line BL3 at a node NA and thus share the bit line BL3.

When using a current sensing type sense amplifier circuit 12 (hereinafter referred to as "current sense amplifier circuit"), such as the one mounted on a conventional flash memory, with the memory cell array 2 thus structured, a switch circuit 504 switching potential applied to bit lines is structured as shown in FIG. 10.

The switch circuit 504 includes switch units 531 to 535 provided corresponding to bit lines BL1 to BL5, respectively.

The switch unit 531 includes an N-channel MOS transistor 542 connected between the read power source line 524, which is supplied with read power source potential VddR via the sense amplifier circuit 12, and the bit line BL1 for receiving a control signal VG1 at its gate. The switch unit 531 further includes an N-channel MOS transistor 544 connected between the ground power source line 522, which is supplied with ground potential GND, and the bit line BL1 for receiving a control signal GG1 at its gate.

The switch unit 532 includes an N-channel MOS transistor 552 connected between the read power source line 524 and the bit line BL2 for receiving a control signal VG2 at its gate, and an N-channel MOS transistor 554 connected between the ground power source line 522 and the bit line BL2 for receiving a control signal GG2 at its gate.

The switch unit 533 includes an N-channel MOS transistor 562 connected between the read power source line 524 and the bit line BL3 for receiving a control signal VG3 at its gate, and an N-channel MOS transistor 564 connected between the ground power source line 522 and the bit line BL3 for receiving a control signal GG3 at its gate.

The switch unit 534 includes an N-channel MOS transistor 572 connected between the read power source line 524 and the bit line BL4 for receiving a control signal VG4 at its gate, and an N-channel MOS transistor 574 connected between the ground power source line 522 and the bit line BL4 for receiving a control signal GG4 at its gate.

The switch unit 535 includes an N-channel MOS transistor 582 connected between the read power source line 524 and the bit line BL5 for receiving a control signal VG5 at its gate, and an N-channel MOS transistor 584 connected between the ground power source line 522 and the bit line BL5 for receiving a control signal GG5 at its gate.

Next, data writing/reading to/from the memory cell will be described. In the memory cell array shown in FIG. 10, each of two bit lines opposite to each other with a memory cell therebetween can be connected to either one of the ground power source line 522 or the read power source line 524. Such a structure allows to change the direction of voltage applied to the memory cell as desired. Each memory cell has two memory areas for enabling data writing/reading to/from different memory areas by changing the direction of the current. In the following, a description will be given focused on the memory cell 112 as a representative.

FIG. 11 is a diagram related to a data writing operation to a memory area L1 of the memory cell 112.

Referring to FIG. 11, potential of the bit line BL2 is set to the write potential VddW and potential of the bit line BL3 is set to the ground potential GND when writing data to the memory area L1. When the word line WL1 is activated to H level, which is the write state, write current Iw1 flows from the bit line BL2 to the bit line BL3 through the non-volatile memory cell 112. At this time, data is written to the memory area L1.

FIG. 12 is a diagram related to a data reading operation from a memory area L1 of the memory cell 112.

Referring to FIG. 12, the bit line BL3 receives the read power source potential VddR via current sense amplifier circuit 12 when reading data from the memory area L1. The bit line BL2 is coupled to the ground potential GND. The threshold voltage of the memory cell with the potentials of the bit lines thus set is large, when the data is written to the memory area L1.

Once the potentials of the bit lines are set, the word line WL1 is activated to H level of the read state. If the threshold voltage of the memory cell is lower than the H level of the read state, then the read current Ir1 flows from the bit line BL3 to the bit line BL2. By detecting the current value of this time with the sense amplifier circuit 12, whether the data has been written to the memory area L1 or not can be read out as information.

As described above, with respect to the memory area L1, directions of current at writing operation and reading operation are opposite.

FIG. 13 is a diagram related to a data writing operation to a memory area L2 of the memory cell 112.

Referring to FIG. 13, the bit line BL3 is provided with the write power source potential VddW and the bit line BL2 is coupled to the ground potential when writing data to the memory area L2. When the word line WL1 is activated to H level of the write state, write current Iw2 flows from the bit line BL3 to the bit line BL2. At this time, data is written to the memory area L2.

FIG. 14 is a diagram related to a data reading operation from the memory area L2 of the memory cell 112.

Referring to FIG. 14, the bit line BL2 is provided with the read power source potential VddR via the sense amplifier circuit 12 when reading data from the memory area L2. The bit line BL3 is coupled to the ground potential GND.

The threshold voltage of the memory cell with the potentials of the bit lines thus set is large, when the data is written to the memory are L2. When the threshold voltage of the memory cell is small, by activating the word line WL1 to the H level of the write state, the read current Ir2 flows from the bit line BL2 to the bit line BL3. By detecting the current value of this time with the sense amplifier circuit 12, whether the data has been written to the memory area L2 or not can be sensed.

As described above, with respect to the memory area L2 also, direction of current at writing operation and reading operation are opposite.

In the conventional NROM, when data reading is to be performed, bit lines are set to the floating state, except for the bit lines connected to the selected cell at both sides.

For example, when data are read from the memory cell 112, all transistors included in the switch units 531, 534 and 535 are set to be non-conductive. The bit lines Bl1, BL4 and BL5 are set at the floating state.

FIG. 15 is an operational waveform diagram related to data reading operation from the memory cell 112 shown in FIG. 10.

Referring to FIGS. 10 and 15, in order to precharge the bit lines BL1 to BL5 at 0V, control signals GG1 to GG5 are activated from L level to H level at time point t1, and control signals GG1 to GG5 are inactivated from H level to L level at time point t2. As a result, the bit lines BL1 to BL5 are in the floating state precharged at 0V.

Subsequently, a read memory cell is selected, and in order to perform data reading, the control signal VG3 is activated from L level to H level at time point t3. As a result, the N-channel MOS transistor 562 is rendered conductive to connect the bit line BL3 and the read power source line 524. Then, the bit line BL3 is provided with the read power source potential VddR via sense amplifier circuit 12.

Simultaneously, the control signal GG2 is activated from L level to H level. Then, the N-channel MOS transistor 554 is rendered conductive to connect the bit line BL2 to the ground power source line 522. As a result, the bit line BL2 is set at the ground potential GND. The potential of the node NA is set at the read power source potential VddR, and the potential of the node NB is set at 0V.

On the other hand, the word line WL1 is set at 0V and thus bit lines are not conductive with each other irrespective of the states of the memory cells 111 and 113. Therefore, the nodes NC and ND remain at the floating state being precharged at 0V.

In this state, at time point t4, the word line WL1 is activated from L level to H level. At this time, if charges are trapped in the memory area L1 of the memory cell 112, then the threshold voltage rises and hence no current flows from the node NA to the node NB. This state corresponds to the state storing data "0".

If no charges are trapped in the memory area L1, then the threshold voltage will not rise, thus in response to the activation of the word line WL1, current flows from the node NA to the node NB. This state corresponds to the state storing data "1". Accordingly, by sensing current with the current sense amplifier 12, data stored in the memory area L1 of the memory cell 112 can be determined.

FIG. 15 shows a state in which charges are trapped in the memory area L1 of the selected memory cell, and hence, not passing current. Actually, however, current flows thorough the sense amplifier circuit 12 for a certain period. Specifically, current flowing from the bit line BL3 to the bit line BL2 and the potential of the node ND gradually increases during a time period of t4 to t5. This is because the memory cells 113 and 114 are in a state not trapping charges in the memory areas, the bit lines BL4 and BL5 are coupled to the read power source potential VddR via these memory cells on activation of the word line WL1, and therefore charging is initiated.

FIG. 16 is a diagram related to charging of the node ND during the time period t4 to t5.

Referring to FIGS. 15 and 16, current does not flow through memory cell during the time period t4 to t5. This is because charges are trapped in the memory area L1 and hence the threshold voltage is increased even when the word line WL1 is activated to H level, thus the transistor is not rendered conductive.

In contrast thereto, charges are not trapped in the memory areas of the memory cells 113 and 114, and thus at these cells transistors are rendered conductive to pass the charging current to bit lines BL4 and BL5.

FIG. 17 shows time changes of current flowing through the sense amplifier circuit 12.

Referring to FIGS. 16 and 17, current as shown in a graph G11 flows through the sense amplifier circuit 12 when no charges are trapped in the memory area L1 and hence when data "1" is stored in the memory area L1. In this case, the current value is stabilized at once and thus no troubles arise.

On the other hand, when charges are trapped in the memory area L1 of the memory cell 112, bit lines BL3 to BL5 require a certain time period to complete the charging even though no current flows through the memory cell 12. The current sense amplifier circuit 12 cannot perform normal sensing operation until the charging current is stabilized. Depending on the sensing performance of the sense amplifier, given a reference value for determining the absence of current flow as approximately 2 $\mu$A, about 25 ns of time from the initiation of sensing is required for a read operation.

As such, for reading data of "0", a certain time period is required until the current value is stabilized, as shown in the graph G10.

SUMMARY OF THE INVENTION

An object of the present invention is to provide a non-volatile semiconductor memory device in which reading speed is improved.

In summary, the present invention provides a non-volatile semiconductor memory device including a first word line, a first to nth bit lines, first to n−1th non-volatile memory cells, and a potential supply circuit.

As used herein, n is a natural number of at least 3, and m is a natural number smaller than n. The first to nth bit lines cross the first word line and are positioned successively in order. The first to n−1th non-volatile memory cells are positioned respectively in n−1 areas between the first and nth bit lines and connected to the first word line together.

Each of the first to n--1th non-volatile memory cells is connected between a higher order bit line and a lower order bit line which are two corresponding bit lines among the first to the nth bit lines. Each of the first to n−1th non-volatile memory cells includes a memory transistor. The memory transistor has its control electrode connected to the first word line and stores one bit depending on whether a first current can flow or not from the higher order bit line to the lower order bit line on activation of the first word line. The memory transistor further stores the other bit depending on whether a second current can flow from the lower order bit line to the higher bit line on activation of the first word line.

The potential supply circuit, to check whether the first current flows through non-volatile memory cell, supplies ground potential to an mth bit line supplies a read power source potential higher than the ground potential to an m+1th bit line, and supplies a bias power source potential higher than the ground potential to an m+2th bit line independent of the read power source potential. The potential supply circuit includes a current sense circuit provided on a path through which the first current flows from the read power source potential to the ground potential for sensing the first current.

Therefore, the main advantage of the present invention is in achieving quick sensing of current to reduce the reading time, when adjacent memory transistors are rendered conductive in response to the activation of word line and no current flows through the read memory transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
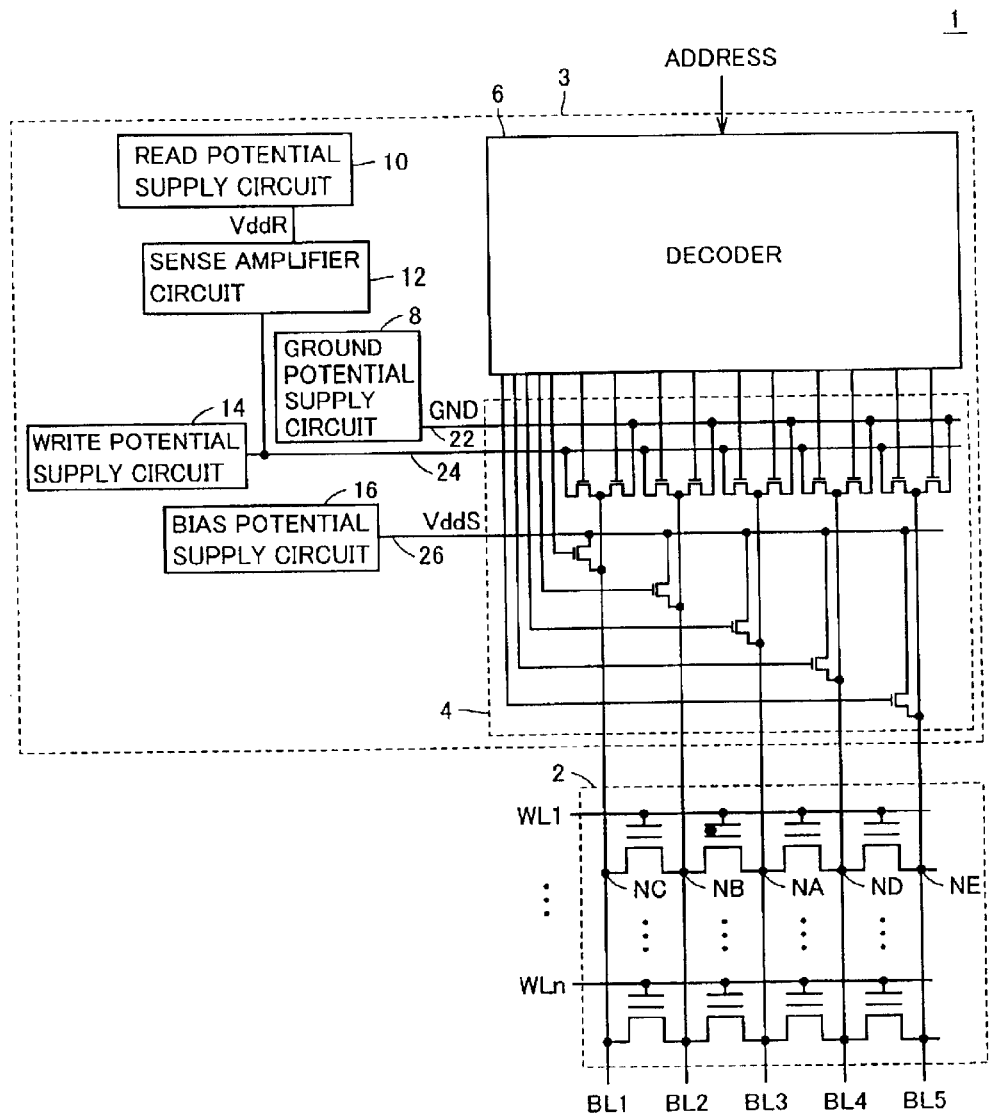
FIG. 1 is a schematic block diagram showing a structure of a non-volatile semiconductor memory device 1 of the present invention.

In the following, embodiments of the present invention will be described in detail referring to the drawings. Similar reference characters refer to the identical or corresponding elements throughout the drawings.

First Embodiment

FIG. 1 is a schematic block diagram showing a structure of a non-volatile semiconductor memory device 1 of the present invention.

Referring to FIG. 1, the non-volatile semiconductor memory device 1 includes bit lines BL1 to BL5, word lines WL1 to WLn, a memory cell array 2 connected to the bit lines BL1 to BL5 and the word lines WL1 to WLn, and potential supply circuit 3 supplying potential to the bit lines BL1 to BL5 on writing/reading data to/from the memory cell array 2.

The potential supply circuit 3 includes a decoder 6 for outputting a control signal for selecting a column of the memory cell in response to an address signal ADDRESS, and a switch circuit 4 for switching potentials to be supplied to the bit lines BL1 to BL5 in response to the control signal output from the decoder 6.

The potential supply circuit 3 further includes a ground potential supply circuit 8 supplying ground potential GND to the switch circuit 4, a bias potential supply circuit 16 for supplying bias potential VddS to the switch circuit 4, and a write potential supply circuit 14 supplying write potential VddW to the switch circuit 4 on data writing. The write potential supply circuit 14 is activated only during the write cycle to output write potential VddW to the potential supply circuit 3.

The potential supply circuit 3 further includes a read potential supply circuit 10 for supplying read potential VddR to the potential supply circuit 3 on data reading, and a sense amplifier circuit 12 connected between the read potential supply circuit 10 and the potential supply circuit 3 for sensing current. The sense amplifier circuit 12 is of a common current sensing type, and is capable of identifying whether the current is flowing or not on data reading.

The potential supply circuit 3 further includes a ground power source line 22 for receiving supply of the ground potential GND from the ground potential supply circuit 8, a read power source line 24 for receiving the write power source potential from the write potential supply circuit 14 on writing and receiving the read power source potential VddR via the sense amplifier circuit 12 on reading, and a bias power source line 26 for receiving the bias potential VddS from the bias potential supply circuit 16.

Figure 2:
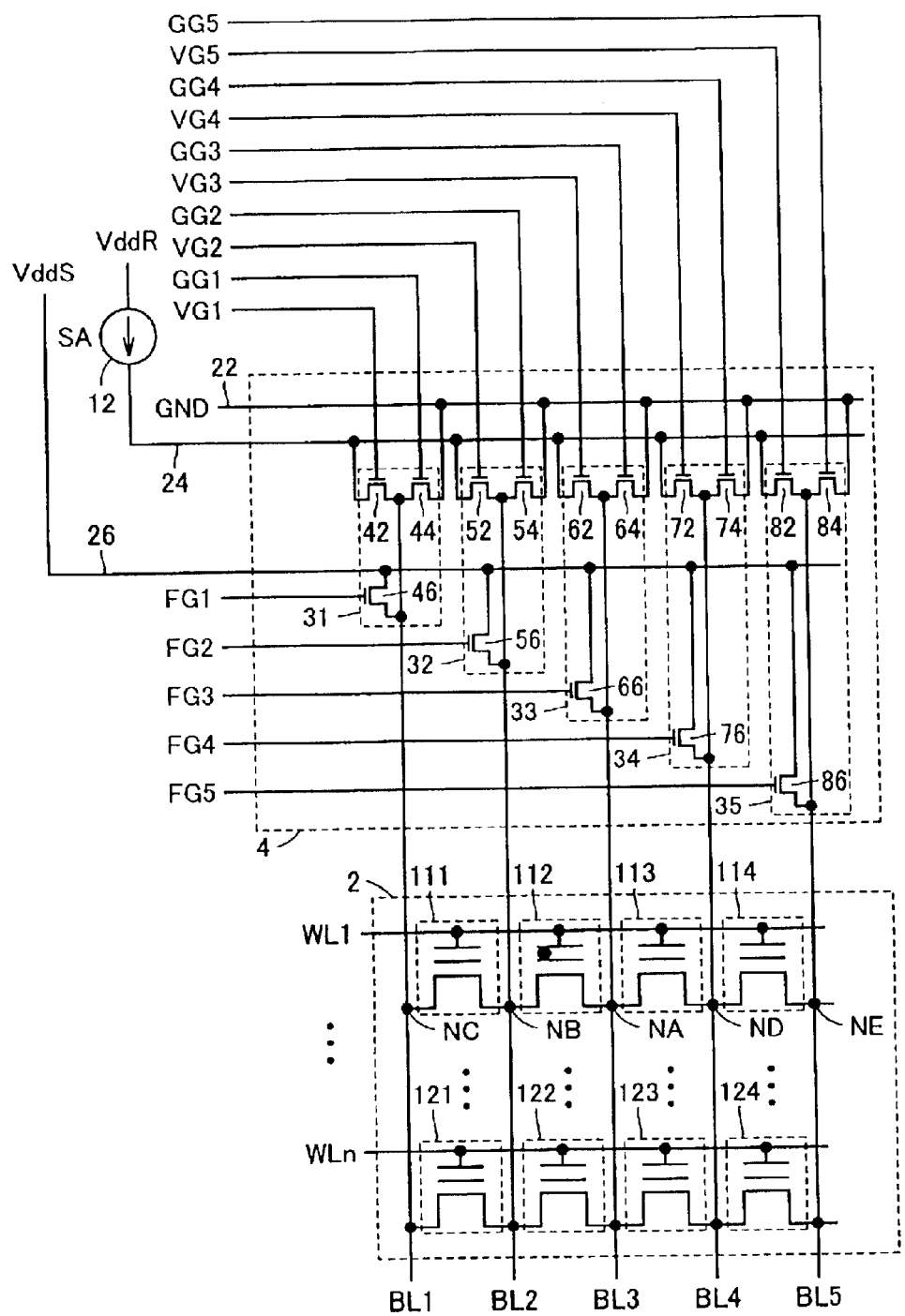
FIG. 2 is a circuit diagram showing a detailed structure of a memory cell array 2 and a switch circuit 4 shown in FIG. 1.

FIG. 2 is a circuit diagram showing a detailed structure of the memory cell array 2 and the switch circuit 4 shown in FIG. 1.

Referring to FIG. 2, the memory cell array 2 includes bit lines BL1 to BL5, word lines WL1 to WLn, memory cells 111 to 114 having their gates connected to the word line WL1, and memory cells 121 to 124 having their gates connected to the word line WLn.

The memory cell 111 is connected between the bit line BL1 and the bit line BL2. The memory cell 112 is connected between the bit line BL2 and the bit line BL3. The memory cell 113 is connected between the bit line BL3 and the bit line BL4. The memory cell 114 is connected between the bit line BL4 and the bit line BL5.

The memory cell 121 is connected between the bit line BL1 and the bit line BL2. The memory cell 122 is connected between the bit line BL2 and the bit line BL3. The memory cell 123 is connected between the bit line BL3 and the bit line BL4. The memory cell 124 is connected between the bit line BL4 and the bit line BL5.

The switch circuit 4 includes switch units 31 to 35 provided corresponding to the bit lines BL1 to BL5, respectively. The control signals VG1 to VG5, GG1 to GG5 and FG1 to FG 5 are applied to the switch circuit 4 from the decoder 6 shown in FIG. 1.

The switch unit 31 includes an N-channel MOS transistor 42 connected between the read power source line 24, to which the read power source potential VddR is supplied via the sense amplifier circuit12, and the bit line BL1 for receiving at its gate a control signal VG1; an N-channel MOS transistor 44 connected between the ground power source line 22, to which the ground potential GND is supplied, and the bit line BL1 for receiving at its gate a control signal GG1; and an N-channel MOS transistor 46 connected between the bias power source line 26, to which the bias potential VddS is supplied, and the bit line BL1 for receiving at its gate a control signal FG1.

The switch unit 32 includes an N-channel MOS transistor 52 connected between the read power source line 24 and the bit line BL2 for receiving at its gate a control signal VG2, an N-channel MOS transistor 54 connected between the ground power source line 22 and the bit line BL2 for receiving at its gate a control signal GG2, and an N-channel MOS transistor 56 connected between the bias power source line 26 and the bit line BL2 for receiving at its gate a control signal FG2.

The switch unit 33 includes an N-channel MOS transistor 62 connected between the read power source line 24 and the bit line BL3 for receiving at its gate a control signal VG3, an N-channel MOS transistor 64 connected between the ground power source line 22 and the bit line BL3 for receiving at its gate a control signal GG3, and an N-channel MOS transistor 66 connected between the bias power source line 26 and the bit line BL3 for receiving at its gate a control signal FG3.

The switch unit 34 includes an N-channel MOS transistor 72 connected between the read power source line 24 and the bit line BL4 for receiving at its gate a control signal VG4, an N-channel MOS transistor 74 connected between the ground power source line 22 and the bit line BL4 for receiving at its gate a control signal GG4, and an N-channel MOS 76 connected between the bias power source line 26 and the bit line BL4 for receiving at its gate a control signal FG4.

The switch unit 35 includes an N-channel MOS transistor 82 connected between the read power source line 24 and the bit line BL5 for receiving at its gate a control signal VG5, an N-channel MOS transistor 84 connected between the ground power source line 22 and the bit line BL5 for receiving at its gate a control signal GG5, and an N-channel MOS 86 connected between the bias power source line 26 and the bit line BL5 for receiving at its gate a control signal FG5.

Figure 3:
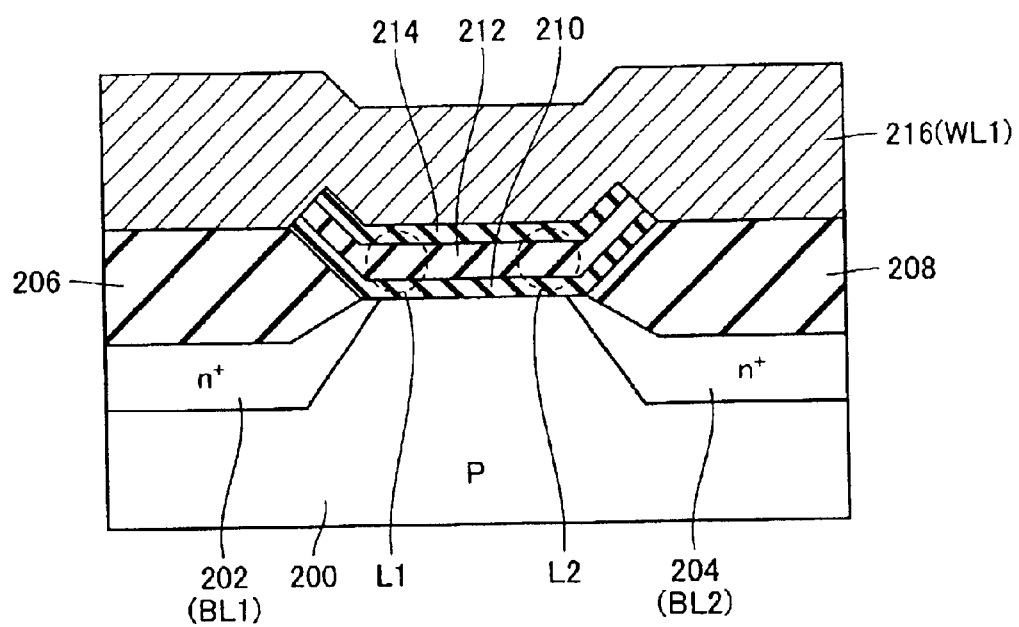
FIG. 3 is a cross sectional view related to a sectional structure of the memory cell 112 shown in FIG. 2.

FIG. 3 is a cross sectional view related to the sectional structure of the memory cell 112 shown in FIG. 2.

Referring to FIG. 3, n-type impurity regions 202 and 204 are formed on a P-type substrate 200. The n-type impurity regions 202 and 204 correspond to the bit lines BL1 and BL2, respectively.

Silicon oxide film 206 and 208 for isolating elements are respectively formed on the n-type impurity regions 202 and 204. A silicon oxide film 210 is formed above the region between the n-type impurity regions 202 and 204, and a nitride film 212 for storing charges is formed further thereon, and a silicon oxide film 214 is formed further thereon. Such a three-layered gate insulating film is referred to as an ONO (Oxide Nitride Oxide) layer structure.

A conductive layer 216 formed by polysilicon or the like is formed on the silicon oxide film 206, 214 and 208. The conductive layer 216 corresponds to the word line WL1 shown in FIG. 2.

Other memory cells shown in FIG. 2 have similar structures, thus descriptions thereof are not repeated.

As shown in the sectional view of FIG. 3, the memory cell is formed with single field effect transistor, and capable of storing one bit of information in each of the left area L1 and right area L2 of the nitride film 212.

Figure 4:
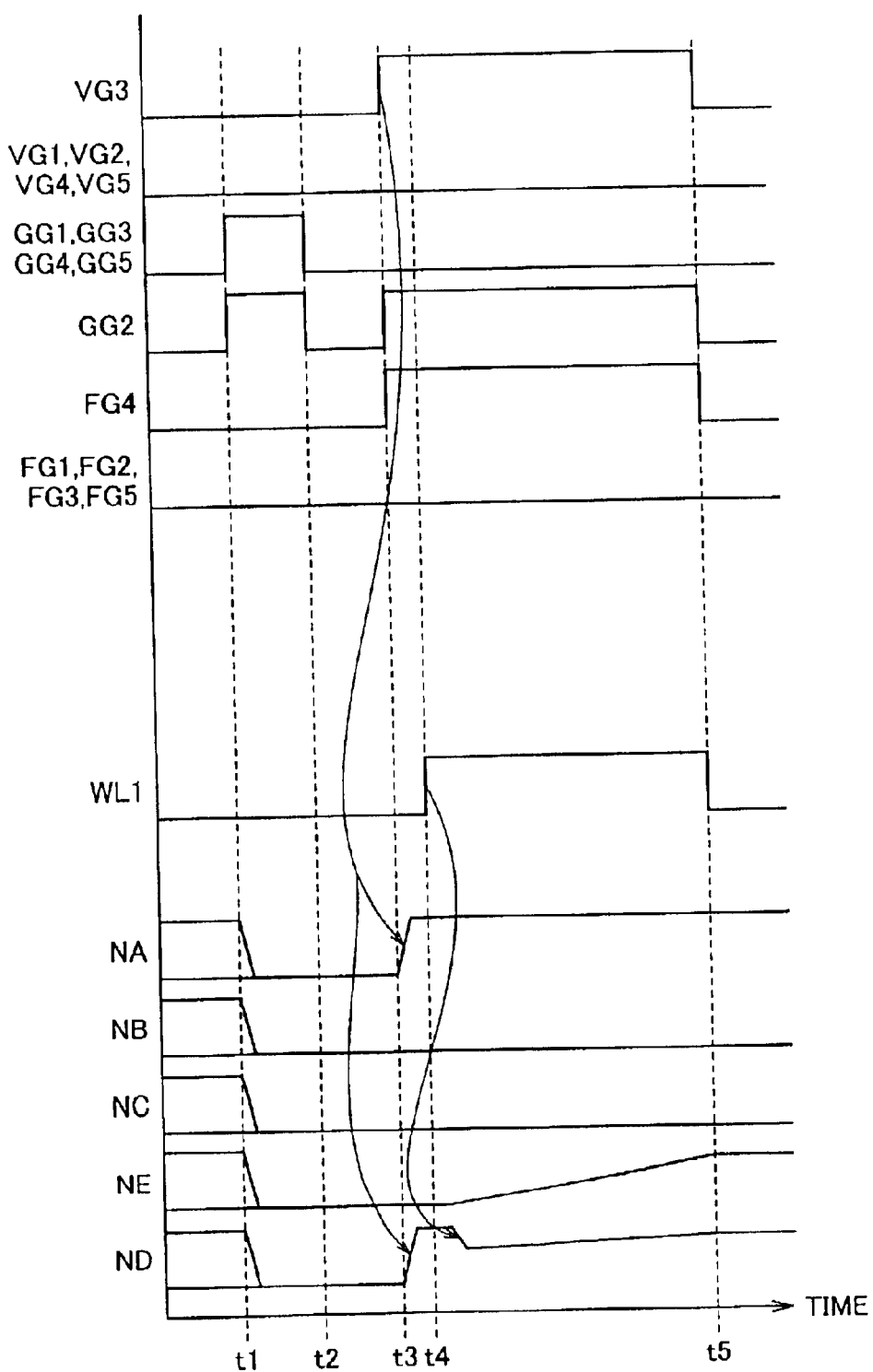
FIG. 4 is an operational waveform diagram related to data reading from the memory cell array 2.

FIG. 4 is an operational waveform diagram related to an operation of data reading from the memory cell array 2.

Referring to FIGS. 2 and 4, control signals GG1 to GG 5 are activated to H level during the time period t1 to t2, and in response thereto the bit lines BL1 to BL5 are connected to the ground power source line 22. At time point t2 the control signals GG1 toGG5 are inactivated from H level to L level, then the bit lines BL1 to BL5 are brought into floating state precharged to the ground potential GND.

At time point t3, the control signals VG3, GG2 and FG4 are activated from L level to H level. In response to the activation of the control signal VG3, the bit line BL3 is connected to the read power source line 24 to receive read power source potential VddR via the sense amplifier circuit 12. In response to the activation of the control signal GG2, the bit line BL2 is connected to the ground power source line 22.

Further, in response to the activation of the control signal FG4, the bit line BL4 adjacent to the bit line BL3 is connected to the bias power source line 26 supplied with the bias potential VddS. Thus, the node ND is charged to the bias potential VddS. Here, the bias power source potential VddS is approximately at the same potential with the read power source potential VddR. For example, when read power source potential VddR is at 3V, then the bias power source potential VddS is also set at 3V.

Thereafter, at time point t4, sense operation is initiated in response to the activation of the word line WL1 from L level to H level. At this time, current does not flow from the node NA via the memory cell 113.

Figure 5:
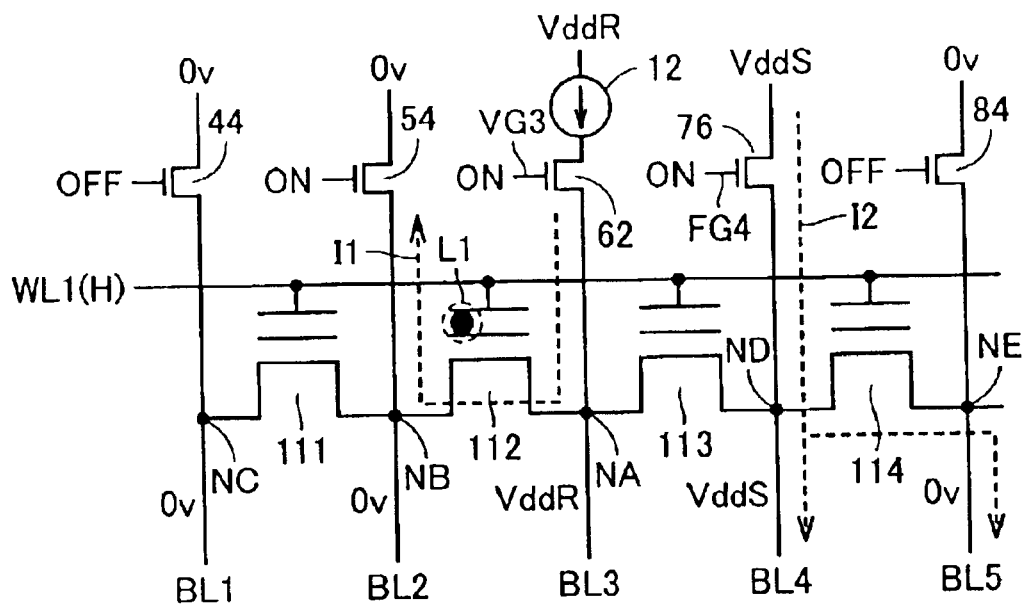
FIG. 5 is a diagram related to current sensing operation of a sense amplifier circuit 12 at a time point t4 indicated in FIG. 4.

FIG. 5 is a diagram related to a current sensing operation of the sense amplifier circuit 12 at time point t4 indicated in FIG. 4.

Referring to FIGS. 4 and 5, at time point 4, the N-channel MOS transistors 44 and 84 are already set in a non-conductive state, whereas the N-channel MOS transistors 54, 62, and 76 are set in a conductive state. Thus the bit line BL2 is set to 0V, and the bit line BL3 is supplied with the read power source potential VddR via the sense amplifier circuit 12. The bit line BL4 is supplied with the bias power source potential VddS.

Then, as the word line WL1 is activated to H level at time point t4, sense current I1 flows through the path indicated in FIG. 5. Bit lines BL4 and BL5, which are non-selected bit lines, are charged with the charge current I2 through the path indicated in FIG. 5. The bias potential VddS is a source of charge current I2. Therefore, even when no charges are stored in the memory area of the memory cell 113, and hence the memory cell 113 is rendered conductive when the word line WL1 is activated, current does not flow from the node NA to the node ND.

Figure 6:
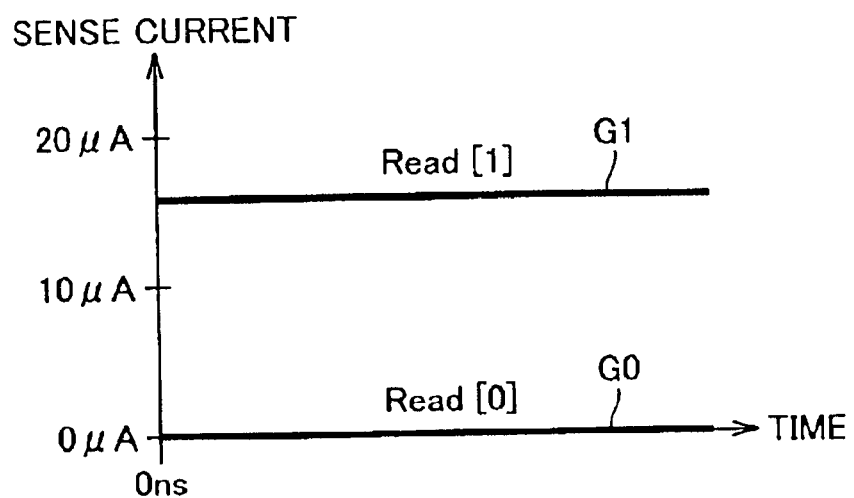
FIG. 6 is a waveform diagram showing time changes of sense current I1 shown in FIG. 5.

FIG. 6 is a waveform diagram showing time changes of the sense current I1 shown in FIG. 5.

Referring to FIGS. 5 and 6, the read current as shown in the graph G1 flows when data "1" is stored in the area L1 of the memory cell 112.

Figure 17:
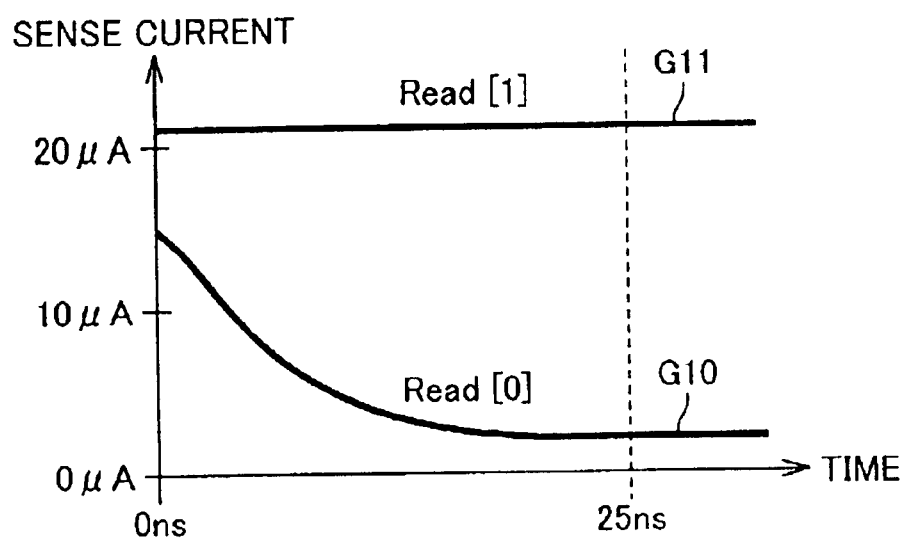
FIG. 17 illustrates time changes of the current flowing through the sense amplifier circuit 12.

When data "0" is stored in the area L1, the memory cell 113 does not pass the current from the node NA to the node ND, thus the read current is stabilized more quickly as indicated by the graph G0, than in the case shown in FIG. 17. According to the non-volatile semiconductor memory device of the first embodiment, reading time can be reduced by the length of waiting time required for the sensing as described with reference to FIG. 17. Specifically, identification of data stored in the memory cell of the sense amplifier circuit 12 will be possible once the word line WL1 is activated.

In case of reading the data stored in the other memory area with respect to the same memory cell, reading time may also be reduced using the bias power source potential VddS similarly for charging bit lines. For example, reading of data stored in the memory area L2 of the memory cell 112 can be achieved by operating the switch unit so as to connect the bit line BL2 to the read power source potential VddR, connect the bit line BL3 to the ground potential, and connect the bit line BL1 to the bias power source potential, respectively.

Similar structures seem be found in a conventional mask ROM or an electrically programmable EPROM. For example, the structure disclosed in FIG. 1 of the Japanese Patent Laying-Open No. 11-306779 is representative.

However, in such prior art, sense voltage is regularly applied in a single direction to the memory cell transistor to be read. Hence, the data detecting circuit (corresponding to the sense amplifier circuit 12 of the present invention) does not have a structure enabling connection to every bit lines.

In contrast thereto, as shown in FIG. 2 of the present invention, any one of the ground power source line 22, read power source line 24 or bias power source line 26 can be connected to each of the bit lines. As such, it is particularly effective to a memory cell such as an NROM having two memory area per one memory cell transistor. In an NROM, voltage is reversely applied on reading as compared to writing, and hence the structure as shown in FIG. 2 is required.

Additionally, since sensing of data stored in a cell can be made without any delay for every bit lines and the voltage applying circuit connected to each bit line is shared by all of the bit lines, effects on sense operation incurred by the difference in position of the selected memory cell can be reduced.

Second Embodiment

A structure will be described, in which larger number of bit lines are additionally provided, and memory cells are provided corresponding to these bit lines, to the structure as described in the first embodiment referring to FIG. 2. A non-volatile semiconductor memory device of a second embodiment includes a memory cell array 2A and switch circuit 4A, respectively replacing the memory cell array 2 and the switch circuit 4 of the non-volatile semiconductor memory device 1 as shown in FIG. 1.

Figure 7:
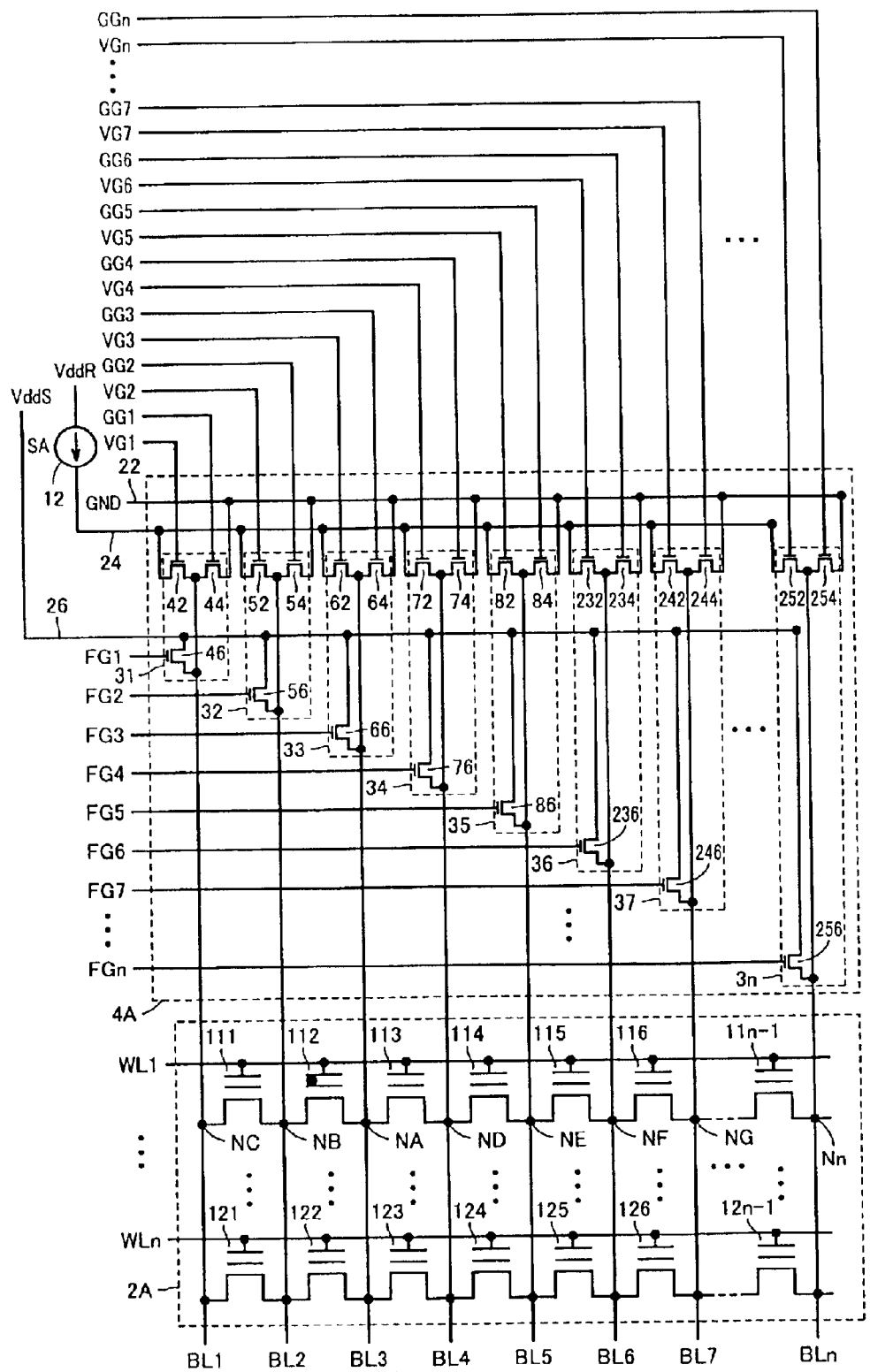
FIG. 7 is a circuit diagram showing structures of memory cell array 2A and switch circuit 4A of a second embodiment.

FIG. 7 is a circuit diagram showing the structure of the memory cell array 2A and the switch circuit 4A of the second embodiment.

Referring to FIG. 7, the memory cell array 2A further includes bit lines BL6 to BLn, memory cells 116 to 11n−1 connected to the wordline WL1, and memory cells 126 to 12n−1 connected to the word line WLn, additionally to the structure of the memory cell array 2 as described above referring to FIG. 2. The memory cell 116 is connected between the bit line BL6 and the bit line BL7. The memory cell 126 is connected between the bit line BL6 and the bit line BL7.

The switch circuit 4A further includes switch units 36, 37, ... 3n, respectively corresponding to the bit lines BL6, BL7, ..., BLn, additionally to the structure of the switch circuit 4 shown in FIG. 2.

The switch unit 36 includes an N-channel MOS transistor 232 connected between the bit line BL6 and the read power source line 24 for receiving at its gate a control signal VG6, an N-channel MOS transistor 234 connected between the bit line BL6 and the ground power source line 22 for receiving at its gate a control signal GG6, and an N-channel MOS transistor 236 connected between the bit line BL6 and the bias power source line 26 for receiving at its gate a control signal FG6.

The switch unit 37 includes an N-channel MOS transistor 242 connected between the bit line BL7 and the read power source line 24 for receiving at its gate a control signal VG7, an N-channel MOS transistor 244 connected between the bit line BL7 and the ground power source line 22 for receiving at its gate a control signal GG7, and an N-channel MOS transistor 246 connected between the bit line BL7 and the bias power source line 26 for receiving at its gate a control signal FG7.

The switch unit 3n includes an N-channel MOS transistor 252 connected between the bit line BLn and the read power source line 24 for receiving at its gate a control signal VGn, an N-channel MOS transistor 254 connected between the bit line BLn and the ground power source line 22 for receiving at its gate a control signal GGn, and an N-channel MOS transistor 256 connected between the bit line BLn and the bias power source line 26 for receiving at its gate a control signal FGn.

The control signals VG6 to VGn, GG6 to GGn and FG6 to FGn are provided from the decoder shown in FIG. 1.

In the first embodiment, when controlled as shown in FIG. 4, after the activation of the word line WL1 at time point t4, the voltage of the node ND temporarily drops since the node NE is charged. In the structure as shown in FIG. 7, since the parasitic capacity of the nodes NE to NN to be charged is large, the voltage drop of the node ND is larger, or the voltage drop continues for longer period.

When the voltage drop is large, the current flowing from the node NA to the node ND is correspondingly large, and it may affect the sense current.

Figure 8:
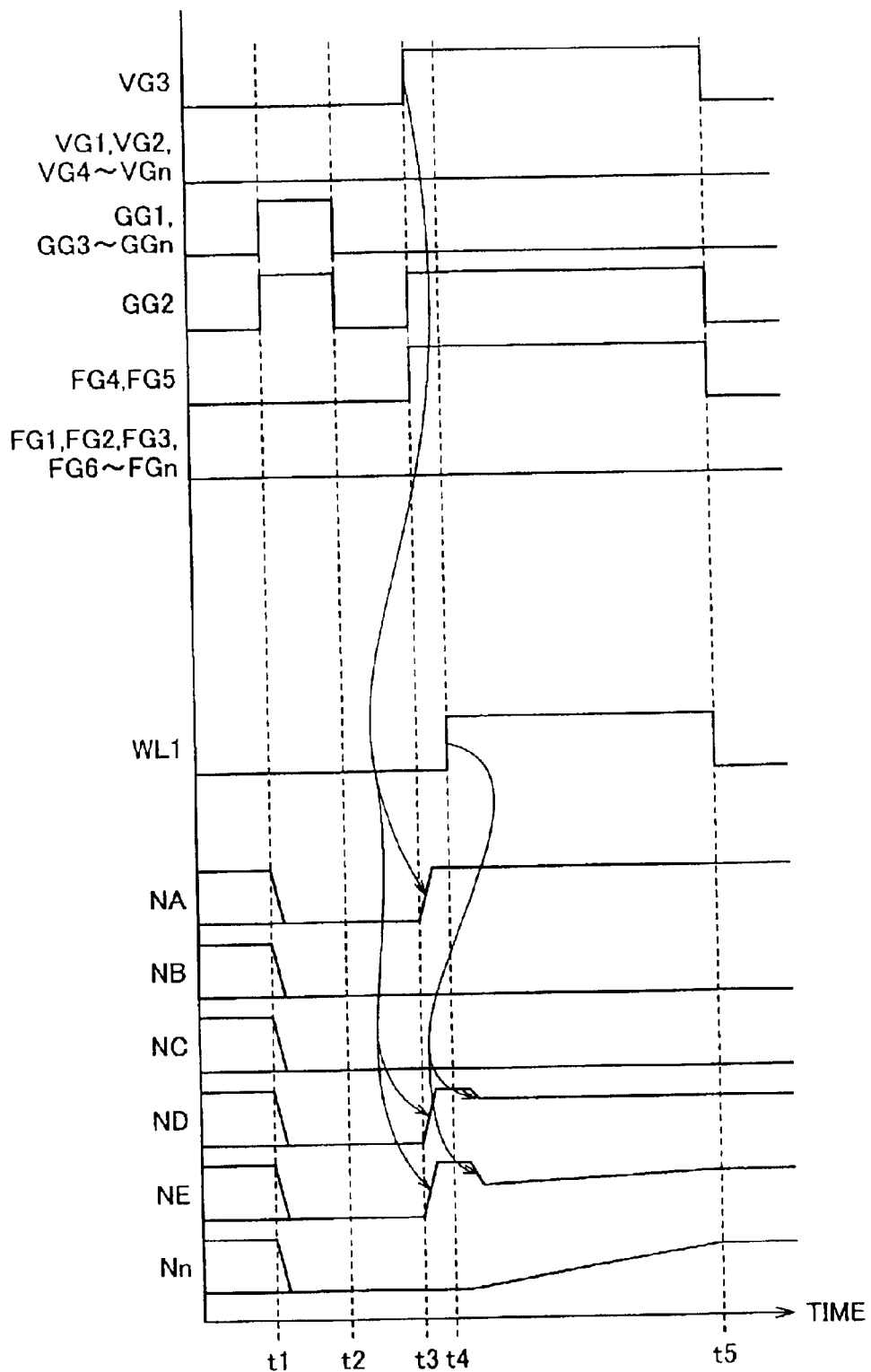
FIG. 8 is an operational waveform diagram related to the operation of a non-volatile semiconductor memory device of the second embodiment.

FIG. 8 is an operational waveform diagram related to the operation of the non-volatile semiconductor memory device of the second embodiment.

Referring to FIGS. 7 and 8, at time period t1 to t2, the bit lines BL1 to BLn are precharged to 0V in response to the control signal GG1 to GGn. At time period t2 to t3, the control signals GG1 to GGn are inactivated, and bit lines BL1 to BLn are in a floating state precharged to 0V.

At time point t3, the control signals FG4 and FG5 are activated from L level to H level. In response thereto, the node NE is charged to the bias potential VddS similarly to the node ND, before the activation of the word line WL1.

Thus, after time point t4, voltage drop of the node ND is alleviated and current is less likely to flow from the node NA to the node ND.

The node of which corresponding control signal FG is not activated at the time point t3, for example the node Nn, completes its charging at the time point t5. In order to reduce the time required for completing the charging, control signal 6 may also be activated at the time point t3. Additionally, further control signals FG7, . . . , may also be activated. Thus, as larger number of bit lines are connected to the bias power source line 26 to be charged to the bias potential, the time required for charging can be reduced. It should be noted that it does not contributes to reduction of sensing time.

Increasing the number of bit lines to be charged alleviates the voltage drop of nodes ND and NE. If the control signals FG4 and FG5 are activated at time point t3 to precharge node ND and NE only, then the voltage drop of the nodes ND and NE will be larger, which may adversely affect the sense current. In such a case, increasing the number of bit lines to be charged is effective.

Third Embodiment

Figure 9:
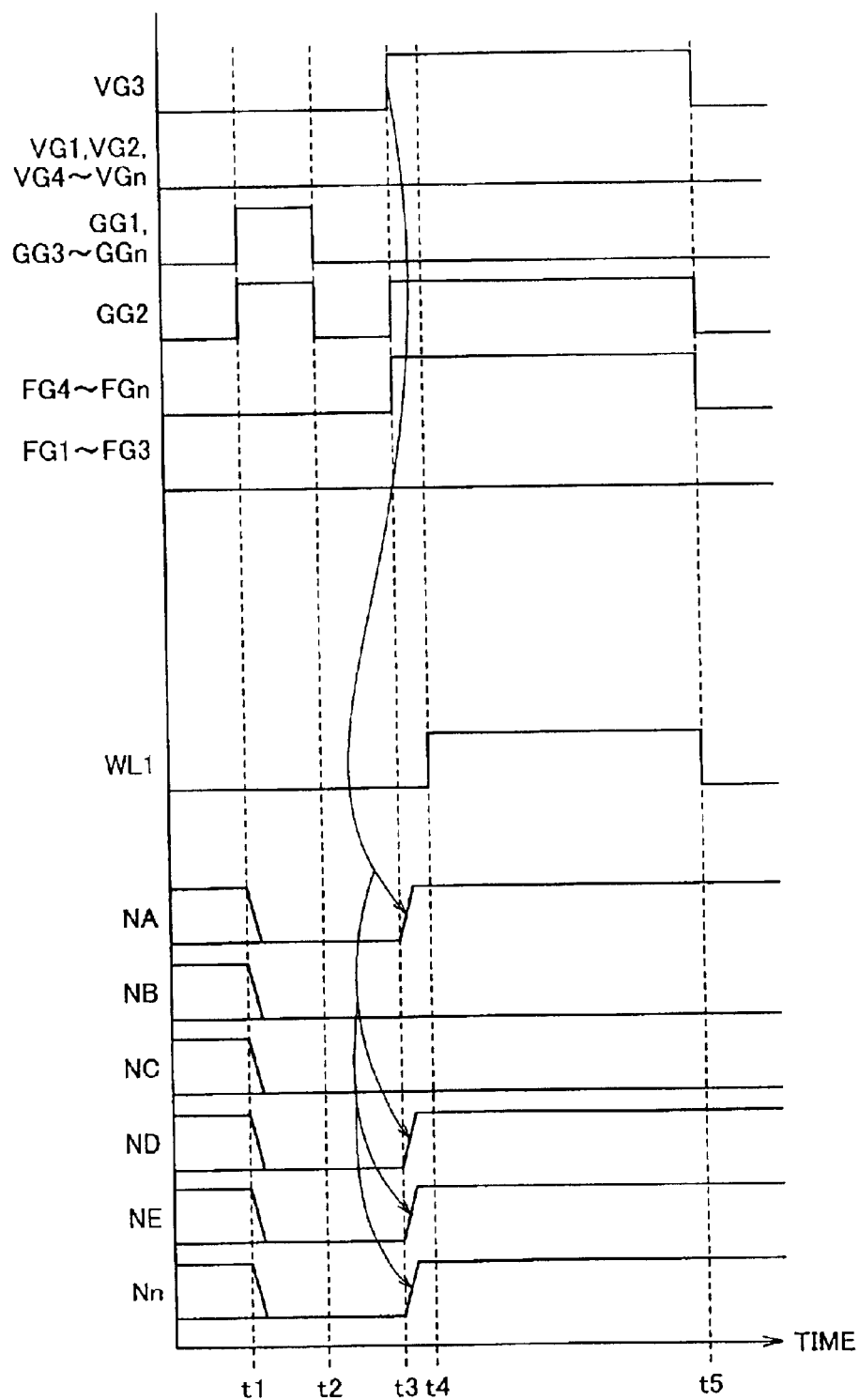
FIG. 9 is an operational waveform diagram related to the operation of a non-volatile semiconductor memory device of a third embodiment.
Figure 10:
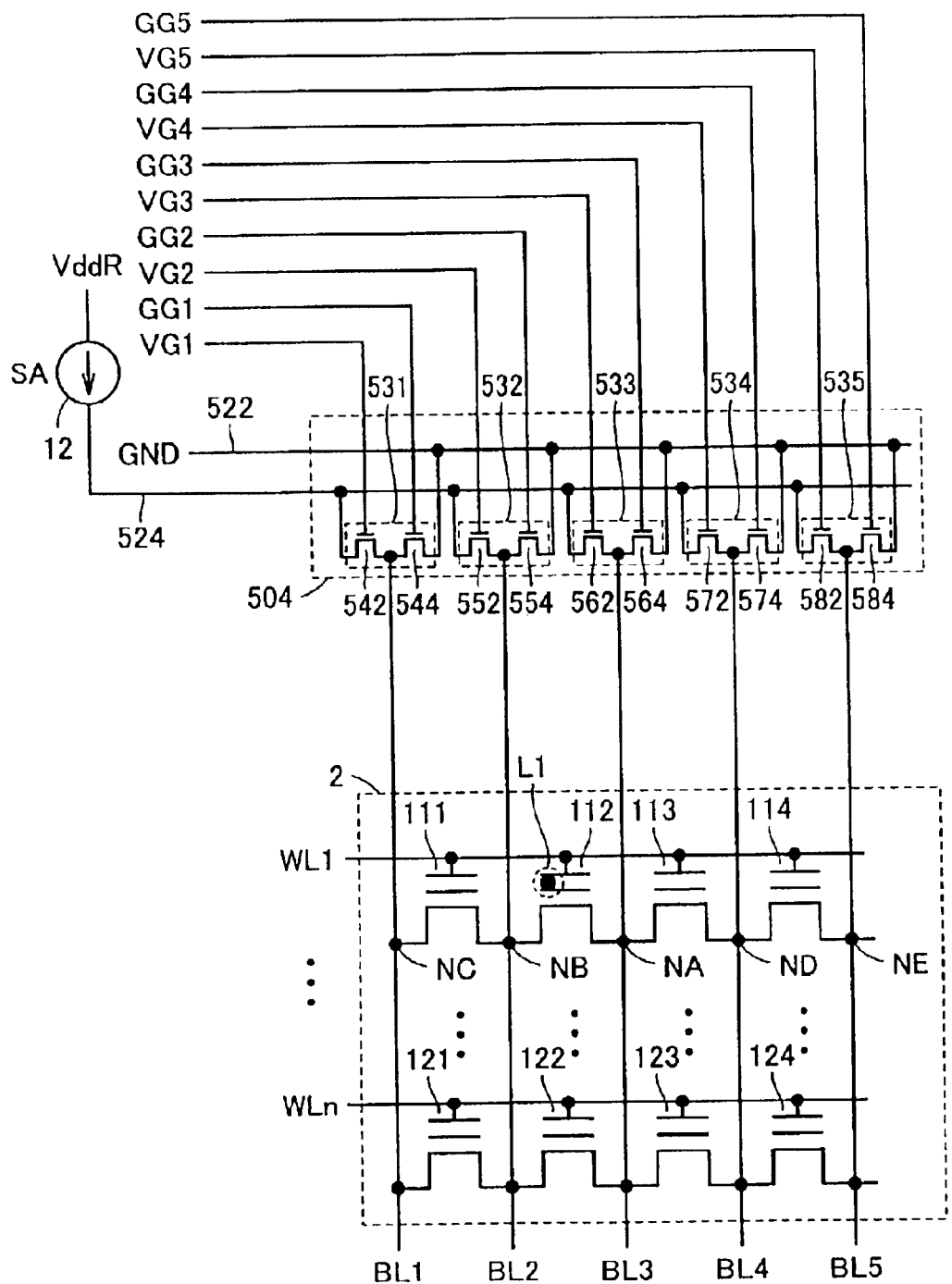
FIG. 10 is a circuit diagram related to an operation of applying potential to bit lines of a memory cell array of the conventional NROM.
Figure 11:
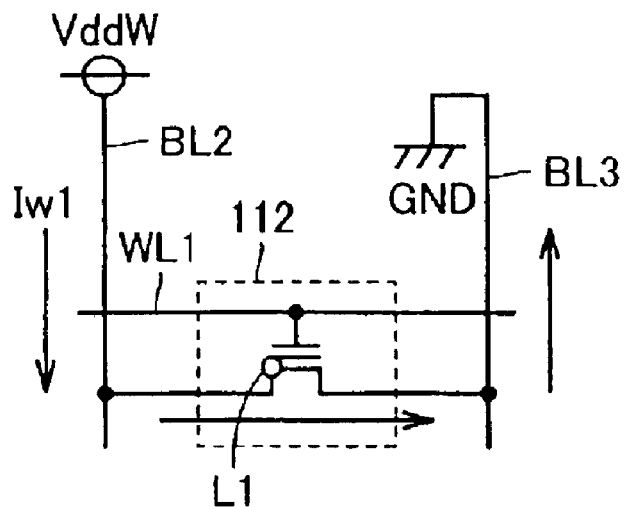
FIG. 11 is a diagram related to an operation of writing data to a memory area L1 of the memory cell 112.
Figure 12:
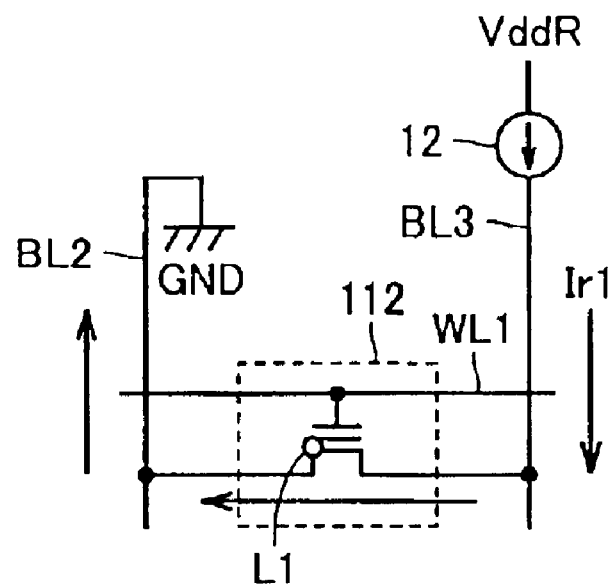
FIG. 12 is a diagram related to an operation of reading data from the memory area L1 of the memory cell 112.
Figure 13:
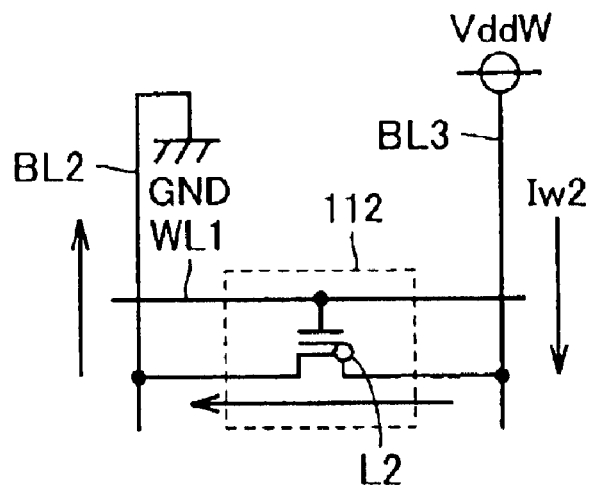
FIG. 13 is a diagram related to an operation of writing data to a memory area L2 of the memory cell 112.
Figure 14:
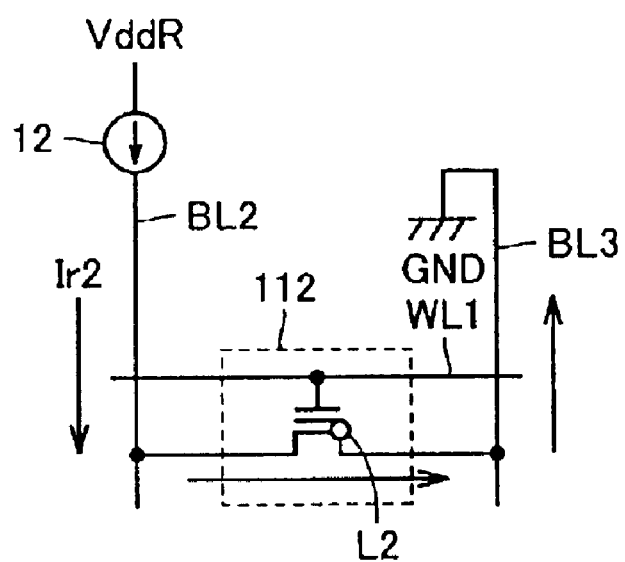
FIG. 14 is a diagram related to an operation of reading data from the memory area L2 of the memory cell 112.
Figure 15:
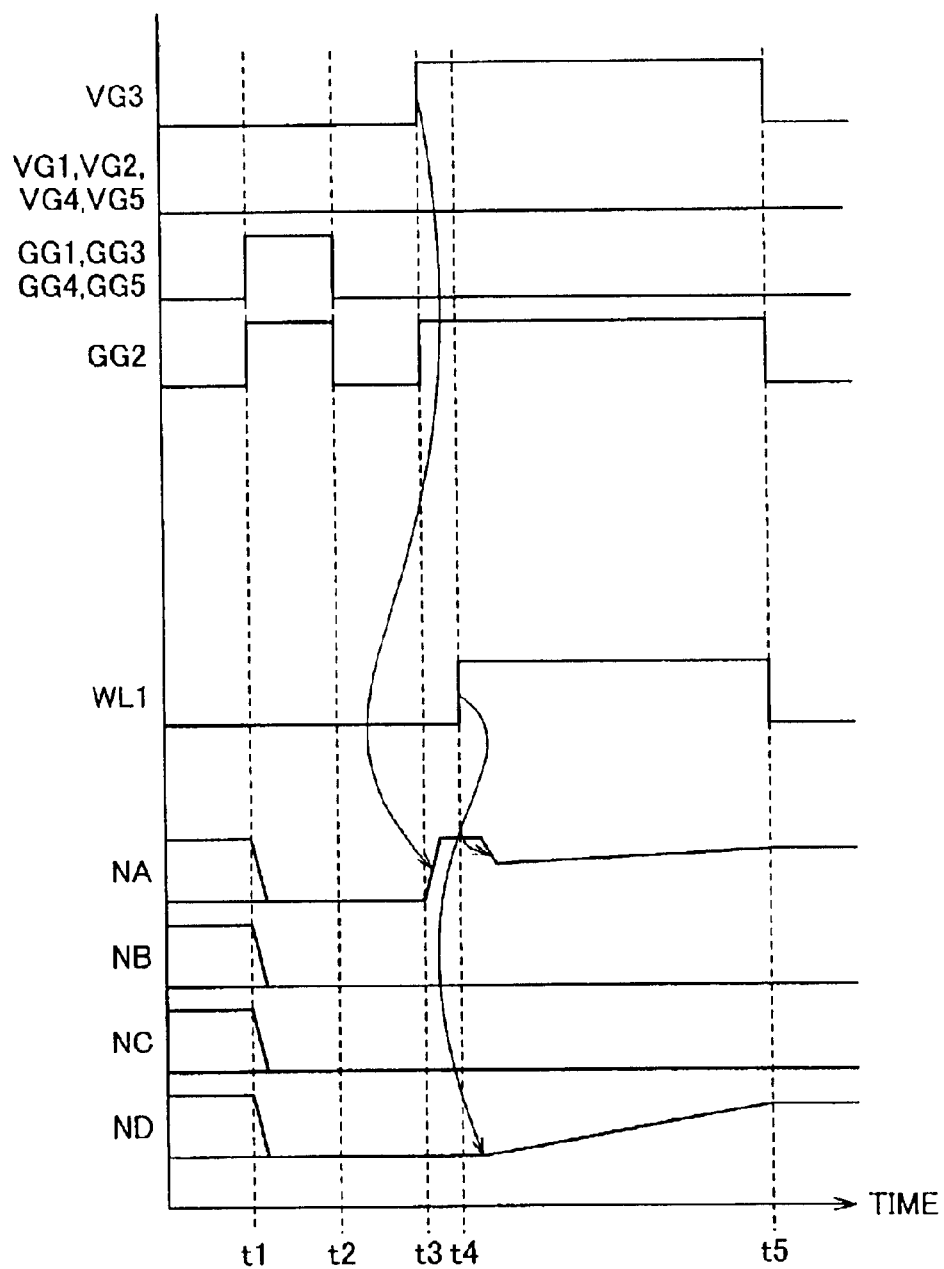
FIG. 15 is a operational waveform diagram related to an operation of reading data from the memory cell 112 shown in FIG. 10.
Figure 16:
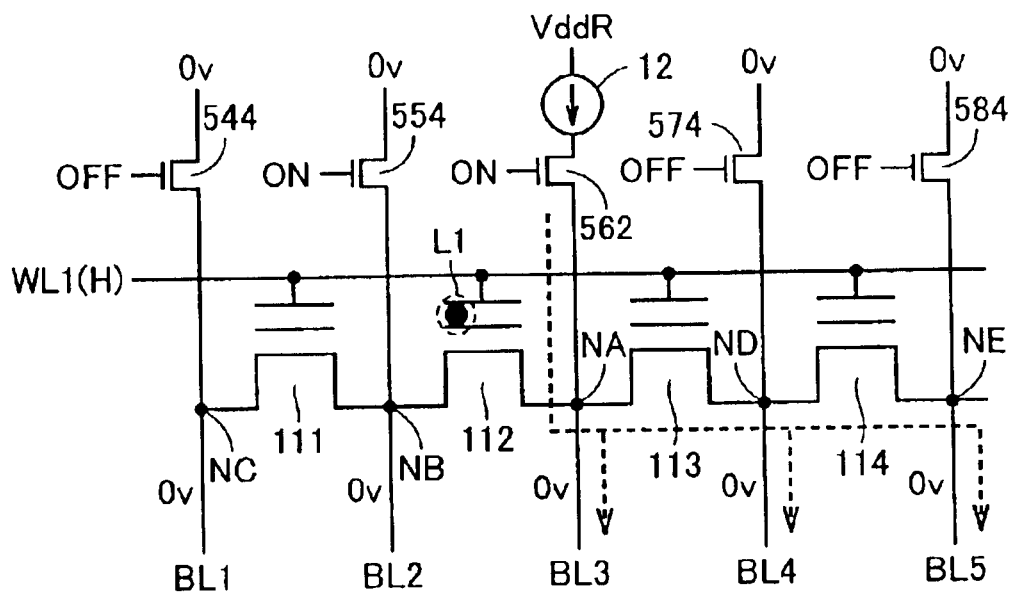
FIG. 16 is a diagram related to charging of a node ND at a time period t4 to t5 shown in FIG. 15.

FIG. 9 is an operational waveform diagram related to the operation of a non-volatile semiconductor memory device of a third embodiment.

Referring to FIGS. 7 and 9, the present embodiment is different from the second embodiment in that, at time point t3 control signals FG4 to FGn are activated to H level and all of the nodes ND to Nn is charged to the sense power source potential. Since undesirable current does not flow after the time point t4 at which the word line WL1 is activated, undesirable noise for signal lines and ground lines will not be generated, and thus the stable sensing operation can advantageously be performed.

Additionally, between the non-selected memory cells, current does not pass between source and drain of the memory cell transistor. It effectively reduces possibility of weak writing operation by hot carriers, which in turn may increase the threshold value of the transistor.

In case of reading the data stored in the other memory area with respect to the same memory cell, reading time may also be reduced using the bias power source potential VddS in the similar manner as for charging bit lines. For example, reading of data stored in the memory area L2 of the memory cell 112 can be achieved by operating the switch unit corresponding to each bit line so as to connect the bit line BL2 to the read power source potential VddR, connect the bit line BL3 to the ground potential, and connect the bit line BL1 to the bias power source potential, respectively.

Additionally, the operation for reading data from a memory cell positioned nearer to the center, for example from the memory cell 114, is performed as follows. First, when reading data stored in the memory area L1, the switch unit corresponding to each bit line should be operated so as to connect the bit line BL5 to the read power source potential VddR, connect the bit line BL4 to the ground potential, and connect bit lines BL6 to BLn to the bias power source potential. When reading data stored in the memory area L2 of the memory cell 114, the switch unit corresponding to each bit line should be operated so as to connect the bit line BL4 to the read power source potential VddR, connect the bit line BL5 to the ground potential and connect the bit lines BL3 to BL1 to the bias power source potential.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor device, where n is a natural number of at least 3 and m is a natural number smaller than n, comprising:

a first word line;

first to nth bit lines crossing said first word line and positioned successively in order; and first to n−1th non-volatile memory cells positioned respectively in n−1 areas between said first and nth bit lines and connected to said first word line together; wherein each of said first to n−1th non-volatile memory cells is connected between a higher order bit line and a lower order bit line as two corresponding bit lines among said first to the nth bit lines, and includes a memory transistor having its control electrode connected to said first word line, storing one bit depending on whether a first current can flow or not from said higher order bit line to said lower order bit line on activation of said first word line, and storing the other bit depending on whether a second current can flow from said lower order bit line to said higher bit line on activation of said first word line;

said non-volatile semiconductor memory device further comprising a potential supply circuit, to check whether said first current flows through an mth non-volatile memory cell, supplying ground potential to an mth bit line, supplying a read power source potential higher than said ground potential to an m+1th bit line, and supplying a bias power source potential higher than said ground potential to an m+2th bit line independent of said read power source potential; wherein said potential supply circuit includes a current sense circuit provided on a path thorough which said first current flows from said read power source potential to said ground potential for sensing said first current.

2. The non-volatile semiconductor device according to the claim 1, wherein said potential supply circuit further includes a ground power source line supplied with said ground potential, a read power source line supplied with said read power source potential via said current sense circuit, a bias power source line supplied with said bias power source potential, a decode circuit outputting a control signal for selecting any one of said first to n−1th non-volatile memory cells in response to an address signal, and a switch circuit performing switching control of each of said first to nth bit lines in response to said control signal for switching a first to third state being connected to said ground power source line, read power source line and bias power source line, respectively, and fourth state not being connected to any of these.

3. The non-volatile semiconductor device according to the claim 1, wherein n is at least 4, and said potential supply circuit supplies said bias power source potential also to an m+3th bit line to check whether said first current flows through said mth non-volatile memory cell.

4. The non-volatile semiconductor device according to the claim 1, wherein m is at least 2, said potential supply circuit, to check whether said second current flows through said mth non-volatile memory cell, supplies said ground potential to said m+1th bit line, supplies said read power source potential to said mth bit line, and supplies said bias power source potential to m−1th bit line independent of said read power source potential, and said current sense circuit is provided on a path through which said second current flows from said read power source potential to said ground potential for sensing whether said second current is flowing.

5. The non-volatile semiconductor device according to the claim 4, wherein m is at least 3, and said potential supply circuit supplies said bias power source potential also to an m−2th bit line to check whether said second current flows through said mth non-volatile memory cell.

6. The non-volatile semiconductor device according to the claim 1, wherein said bias power source potential is at equal potential as said read supply potential.

* * * * *